United States Patent [19]
Yamazaki et al.

[11] Patent Number: 5,621,224
[45] Date of Patent: Apr. 15, 1997

[54] SEMICONDUCTOR DEVICE INCLUDING A SILICON FILM HAVING AN IRREGULAR SURFACE

[75] Inventors: Shunpei Yamazaki, Tokyo; Satoshi Teramoto, Kanagawa, both of Japan

[73] Assignee: Semiconductor Energy Laboratory Co., Ltd., Kanagawa, Japan

[21] Appl. No.: 539,180

[22] Filed: Oct. 5, 1995

[30] Foreign Application Priority Data

Oct. 7, 1994 [JP] Japan .................................. 6-270366

[51] Int. Cl.[6] .................................................. H01L 29/76
[52] U.S. Cl. .................. 257/66; 257/70; 257/72; 257/75
[58] Field of Search .............................. 257/66, 70, 72, 257/75, 347, 352, 739; 359/54, 59, 87

[56] References Cited

U.S. PATENT DOCUMENTS

| | | |
|---|---|---|
| 5,147,826 | 9/1992 | Liu et al. .................................. 437/233 |
| 5,275,851 | 1/1994 | Fonash et al. ........................... 427/578 |
| 5,508,533 | 4/1996 | Takemura .................................. 257/66 |

OTHER PUBLICATIONS

C. Hayzelden et al., "In Situ Transmission Electron Microscopy Studies of Silicide–Mediated Crystallization of Amorphous Silicon" (3 pages), Oct. 1991.

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640, 1986.

T. Hempel et al., "Needle–Like Crystallization of Ni Doped Amorphous Silicon Thin Films", *Solid State Communications*, vol. 85, No. 11, pp. 921–924, 1993. Mar.

R. Kakkad et al., "Crystallized Si films by low–temperature rapid thermal annealing of amorphous silicon," *J. Appl. Phys.*, 65(5), Mar. 1, 1989, pp. 2069–2072.

G. Liu et al., "Polycrystalline silicon thin film transistors on Corning 7059 glass substrates using short time, low–temperature processing," *Appl. Phys. Lett.* 62(20), May 17, 1993, pp. 2554–2556.

G. Liu et al., "Selective area crystallization of amorphous silicon films by low–temperature rapid thermal annealing," *Appl. Phys. Lett.* 55(7), Aug. 14, 1989, pp. 660–662.

R. Kakkad et al., "Low Temperature Selective Crystallization of Amorphous Silicon," *Journal of Non–Crystalline Solids*, 115, 1989, pp. 66–68.

*Primary Examiner*—Minhloan Tran
*Attorney, Agent, or Firm*—Sixbey, Friedman, Leedom & Ferguson, PC; Gerald J. Ferguson, Jr.; Jeffrey L. Costellia

[57] ABSTRACT

A thin film transistor with high performance and improved productivity is offered using crystalline silicon film. As the crystalline silicon film that constitutes the active layer of thin film transistor, the one which has irregularities of 100 to 700 Å in level difference is used. Such crystalline silicon film can be obtained by performing laser light irradiation.

13 Claims, 6 Drawing Sheets

Heat Treatment and Laser Irradiation

Impurity Ion Implantation and Laser Irradiation

FIG. 7D

SEMICONDUCTOR DEVICE INCLUDING A SILICON FILM HAVING AN IRREGULAR SURFACE

BACKGROUND OF THE INVENTION

1. Field of the Invention

The invention disclosed in this specification relates to the structure of thin film semiconductor element such as thin film transistor and thin film diode and to the production thereof, and also to the thin film semiconductor to construct these thin film semiconductor elements and to the production thereof.

2. Description of the Prior Art

Recently, optical apparatus such as liquid-crystal display apparatus and image sensor that use thin film transistors are being developed. This uses a glass substrate as the substrate, forms a thin film semiconductor on the surface of this glass substrate, constitutes an active layer of thin film transistor using this thin film semiconductor, and constitutes the drive circuits and switching circuits of optical apparatus using this thin film transistor.

As the thin film silicon semiconductor formed on an insulating substrate such as glass, the technique that uses a silicon film having crystal properties is known. The transistor that uses this thin film silicon semiconductor having crystal properties is expected to have high characteristics and the application to liquid crystal display devices of active matrix type and thin film integrated circuits is expected.

FIG. 1 shows one example of the fabricating process of the thin film transistor utilizing the crystalline silicon film.

First, a silicon oxide film 102 as an underlying film is formed to a thickness of 3000 Å on a glass substrate 101. Then, an amorphous silicon film 103 is formed thereon to a thickness of 200 to 1000 Å by the plasma CVD method.

And the amorphous silicon film 103 is crystallized by conducting heating at 600° C. and irradiation with laser light. The reason why the heating temperature is specified at 600° C. is that, in general, the glass substrate presents difficulties in applying heat treatment at temperatures above 600° C.

However, in order to crystallize the amorphous silicon film 103 by heating and to obtain a crystalline silicon film having good crystal properties (having crystal properties good enough for practical use), it is necessary to apply heat treatment at temperatures above 800° C., preferably above 1000° C.

Thus, the technique using irradiation with laser light in combination, thereby improving the crystal properties, no matter what the improvement, is utilized. Incidentally, it is possible to crystallize the amorphous silicon film 103 only by irradiation with laser light, but this is not practical because when the amorphous silicon film 103 is crystallized only by irradiation with laser light, there is a problem in the uniformity of the film quality thus obtained.

That is, in the case where one attempts to irradiate laser light over a large area at a time, the unevenness of laser power strength in the beam pattern becomes a problem and it becomes difficult to irradiate laser light at uniform power over the entire surface. Also, there is a method of crystallizing the amorphous silicon film 103 while scanning laser light; however, in this case there is a problem that the irradiating power of laser light gradually changes with the lapse of time. Likewise, it is difficult to irradiate the laser light uniformly over a large area.

These problems are solved by using with a margin a laser oscillating apparatus having a large irradiating power; however, in this case, there occurs another problem that the cost required to produce and maintain the laser oscillating apparatus becomes high.

Thus, improving the uniformity of quality of the resulting crystalline silicon film and productivity through crystallization by heating and laser light irradiation is being practiced.

Figure 1A:
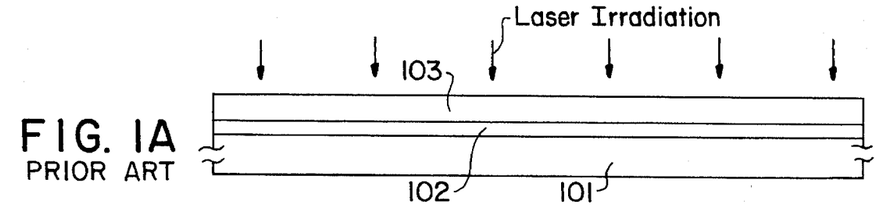
FIGS. 1(A) to 1(D) show sectional views of steps in the fabrication of a conventional thin film transistor.
Figure 1B:
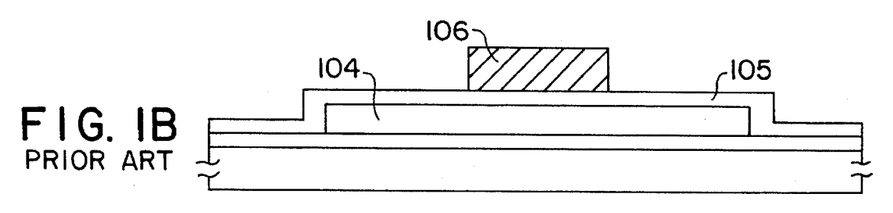

After crystallization of the amorphous silicon film 103 in the step shown in FIG. 1(A), the active layer 104 of thin film transistor is formed by patterning. And, the silicon oxide film 105 to become the gate insulating film is formed to a thickness of 1000 Å by the plasma CVD method. Moreover, the gate electrode 106 is formed from metal or silicide or even from crystalline silicon semiconductor having one conductivity type. (FIG. 1 (B))

After the state shown in FIG. 1(B) has been obtained, the implantation of impurity ions (such as phosphorus ions) to impart one conductivity type is carried out, thereby forming the source/drain regions in self-aligned manner. In this case, the gate electrode 106 becomes a mask so that impurity ions are implanted only into the region to become the source region 108 and the region 112 to become the drain region. The channel forming region 110 is also formed in self-alignment manner. This step is called the self-alignment process. (FIG. 1(C))

Figure 1C:
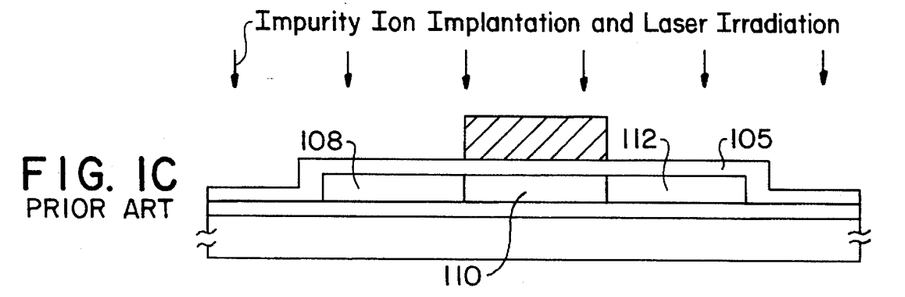
Figure 1D:
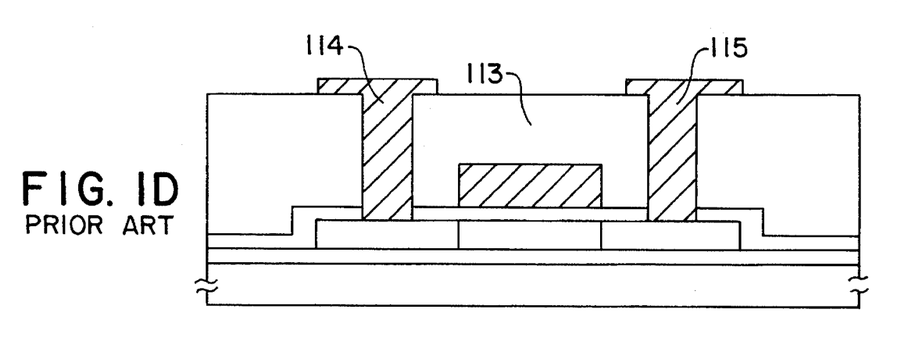

After the implantation of impurity ions has been conducted in the step of FIG. 1(C), irradiation of laser light is carried out, thereby performing the recrystallization of the source/drain regions 108, 112 and the activation of implanted ions. The reason why laser light irradiation is necessary is that the region into which impurity ions have been implanted is made amorphous by the shock of implanted ions, and the implanted ions as such are not yet activated as required of silicon for one conductivity type.

Then, the silicon oxide film 113 as the interlayer insulating film is formed to a thickness of 7000 Å by the plasma CVD method. Contact holes are formed in the silicon oxide film 113, and the source electrode 114 and the drain electrode 115 are formed there. In this way the thin film transistor is completed. (FIG. 1(D))

The thin film transistor using crystalline silicon film formed on the glass substrate as shown in FIG. 1 is such that the off current characteristics is a serious problem. The off current denotes the current that flows between the source/drain regions when the thin film transistor is in the off state.

For example, when a thin film transistor is arranged in each picture element of a liquid crystal display device of active matrix type, the thin film transistor arranged in each picture element retains charge in the picture element electrode and hence functions as a switch, but if the off current is great, the charge held in the picture element escapes and it is impossible to maintain the image data for a length of time required.

This problem of off current is a serious problem in the case where the memory is constructed from thin film transistors using crystalline silicon film, and hence there is a demand for its improvement.

In addition, the crystalline silicon film formed as mentioned above has the polycrystalline structure or microcrystalline structure, and from the viewpoint of crystal, it is not necessarily good in crystal properties in many cases, and the amorphous component and trap level are present in the film in a nonnegligible density. Such amorphous component and trap level are the major factor of the change with time (fluctuation of threshold value and deterioration of characteristics) of the characteristic properties of the thin film transistor.

SUMMARY OF THE INVENTION

The present invention disclosed in this specification is intended to solve at least one of the problems enumerated below.

(1) To provide a crystalline silicon film which has good crystal properties and from which one can expect high characteristic properties when utilized for thin film transistors.

(2) To obtain a thin film transistor with as small an off current as possible.

(3) To make as high as possible the characteristic properties of the thin film transistor using crystalline silicon thin film.

(4) To provide a thin film transistor which is free from the change with time of characteristic properties.

First of all, description will be made of the background which led to the present invention disclosed in this specification.

According to the research by the present inventors, it has been found that in the case where a thin film transistor is constructed using a crystalline silicon film obtained by irradiation with laser light, it is desirable to keep the thickness of the crystalline silicon film below 1000 Å, preferably below 800 Å. As the foundation of this, the following three factors can be listed.

(1) The first factor:

In the event that irradiation with laser light is carried out as shown in FIG. 1(A) or FIG. 1(C), there is a point which becomes a problem. The problem is that when laser light is irradiated to the amorphous silicon film, the laser light is absorbed at the surface (a depth of several tens of Å to several hundreds of Å of the amorphous silicon film and consequently, if the film thickness of the amorphous silicon film is thick, it is possible to obtain the effect of irradiation with laser light only at the surface. The problem becomes salient in the case where laser light in ultraviolet region (wavelengths below approximately 400 nm), which produces the best effect, is used. Incidentally, "the effect by irradiation with laser light" means the effect of improving the crystal properties and of reducing the trap density, and it also means the effect of activating implanted impurities.

There is an experimental fact that if the effect of irradiation with laser light reaches only the surface of the amorphous silicon film because the thickness of the amorphous silicon film is thick as mentioned above, the characteristic properties of the finally obtained thin film transistor are poor. It is considered that this is due to the causes (A) to (D) shown below.

(A) The trap level density in the film as the whole becomes high.

(B) Since the energy of laser light dissipates, good crystal properties are not obtained even at the surface of the film.

(C) On account of the effect of the lower layer part of the film remaining as amorphous, the crystal properties of the film surface does not become so high.

(D) The transfer of carriers conducting through the crystalline upper layer part undergoes trapping and dispersion by the lower layer part of the film remaining as amorphous, and the characteristic properties as the thin film transistor also become low.

Figure 2A:
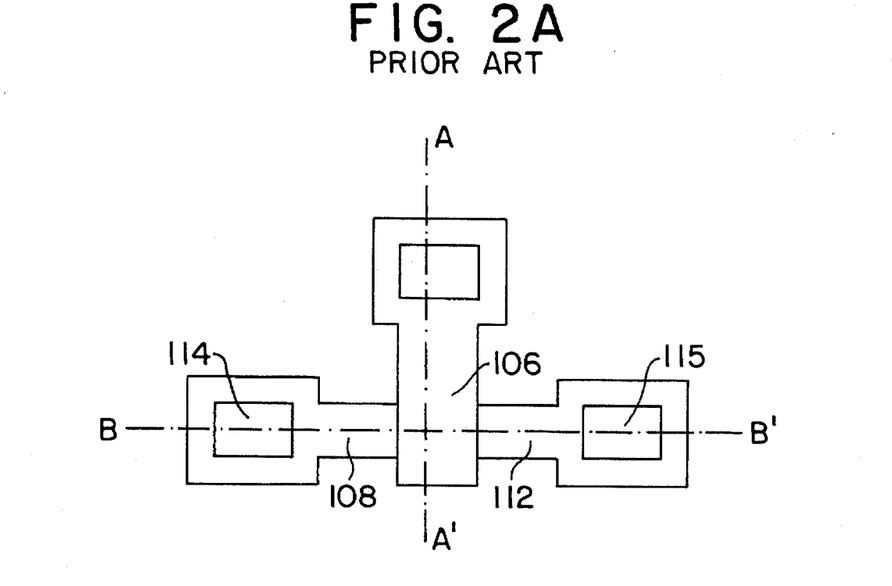
FIG. 2(A) is a top view.

If the crystalline silicon film is to be produced by using irradiation with laser light as mentioned above, it is necessary to make as thin as possible the crystalline silicon film constituting the active layer so that the crystal properties in the film thickness direction are made uniform. To be concrete, it has been found by experiments that it is necessary to reduce the thickness of the active layer below 1000 Å, preferably below 800 Å.
(The first factor)
(2) The second factor:

FIG. 2(A) shows the top view of the thin film transistor whose manufacturing step is shown in FIG. 1. The sectional view cut along B B' in FIG. 2(A) corresponds to FIG. 1(D). And the sectional view cut along A—A' corresponds to FIG. 2(B).

Figure 2B:
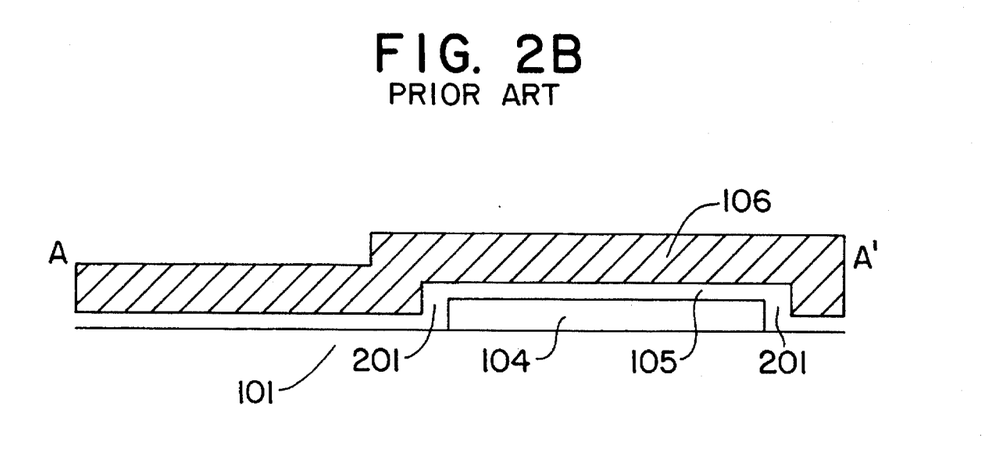
FIG. 2(B) is a sectional view along the line A–A' in FIG. 2(A).

In general, the thickness of the gate insulating film 105 is 500 to 2000 Å, usually about 1000 Å in the case where a silicon oxide film or a film composed mainly of silicon oxide is used). In the case where the thickness of the active layer is approximately equal to or greater than the thickness of the gate insulating film, for example, in the case where the thickness of the active layer is above 1000 Å and the thickness of the gate insulating film 105 is about 1000 Å it is difficult to form with good step coverage the gate insulting film 105 on the side 201 of the active layer 104 as shown in FIG. 2(B), and the gate insulating film 105 becomes thin at the side 201 and it becomes impossible to completely cover the active layer 104, and there is the possibility of the active layer 104 being exposed. Or, pinholes are formed even though the active layer 104 is not exposed.

If it is possible to make the gate insulating film 105 sufficiently thick, it is possible to solve the above-mentioned problem; however, the thickness of the gate insulating film 105 is an important factor which determines the characteristic properties of the thin film transistor, it is impossible to make it thick recklessly. Also, in the case where the self-alignment technique is employed, it is necessary to implant impurity ions through the gate insulating film 105 as shown in FIG. 1(C), however, if the gate insulating film is thicker than 1500 Å or even thicker than 2000 Å implantation of impurity ions through the gate insulating film 105 becomes difficult to perform. Therefore, in order to use this self-alignment technique, it is required that the thickness of the gate insulating film 105 should be below 1500 Å.

Due to the fact that the thickness of the gate insulating film 105 is limited and its thickness cannot be increased without bound as mentioned above, the step coverage of the gate insulating film 105 is not good and hence there is the possibility that the gate electrode 106 and the active layer 104 partly come into direct contact with each other and the source region 108 and the drain region 112 are short-circuited by the gate electrode 106. Consequently, carriers move between the source/drain regions 108, 112 without passing through the channel forming region, and as a matter of course, the off current increases.

In general, in view of the fact that the thickness of the gate insulating film is about 1000 Å, if the thickness of the active layer is made below about 1000 Å, preferably below 800 Å, then it is possible to prevent to some extent the above-mentioned problem resulting from the poorness of step coverage of the gate insulating film. (The second factor)
(3) The third factor:

In order to form the active layer, the step to perform patterning by etching the resulting crystalline silicon film becomes necessary. In general, dry etching (such as RIE method) having anisotropism is used for the patterning of the active layer; however, at this time a large number of detects are formed on the end side of the active layer. Then, in the state in which the thin film transistor has been completed, the movement of carriers through these defects on the side of the active layer (which constitutes the trap level as a matter of course) takes place, with the result that the off current increases.

The movement of carriers through the side of the active layer is proportional to the area of the side of the active layer as a matter of course. Therefore, the thinner the active layer, the smaller the value of off current. And, this has been experimentally confirmed. To put it concretely, it has been confirmed that as compared with the off current of the thin film transistor having a 1200 Å thick active layer constructed of crystalline silicon film, the off current of the thin film transistor having a 200 Å thick active layer constructed of crystalline silicon film is lower about one order of magnitude. As mentioned above, it is desirable that the thickness of the active layer be as thin as possible if the reduction of off current is intended.

The present invention disclosed in this specification was achieved on the basis of the above-mentioned findings.

One of the main aspect of the invention disclosed in this specification is a semiconductor device using a silicon film having crystallinity, wherein the average film thickness of said silicon film is 150 to 800 Å, the surface of said silicon film has irregularities, and the level difference of said irregularities is 100 to 700 Å.

In the above-mentioned structure, the silicon film having crystallinity is formed on a substrate, such as glass, having an insulating surface. This silicon film having crystal properties can be obtained by irradiating with laser light an amorphous silicon film or a silicon film which has been crystallized by heating. To this end, it is necessary that the film thickness of the silicon film should be smaller than 800 A. And, if the thickness is smaller than 150 Å, there will be an instance in which pinholes occur and film is not formed, and hence it is not of practical use as the thin film transistor. In the above-mentioned structure, the average film thickness means the film thickness of the state in which the irregularities of the film are flattened.

Figure 4:
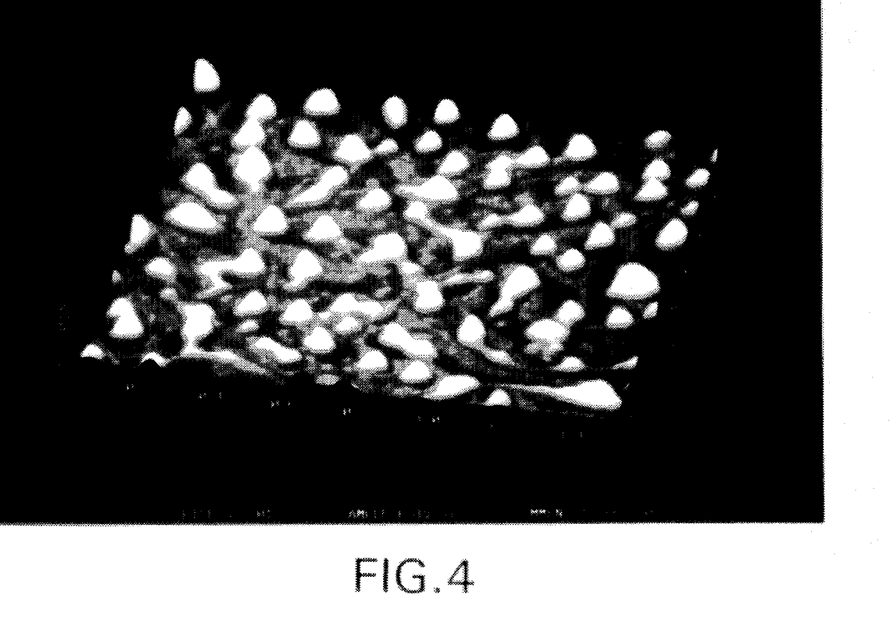
FIG. 4 shows a photograph of thin film.

In the case where a silicon film having a film thickness below 800 Å (this silicon film has the amorphous properties or crystal properties) is crystallized by irradiation with laser light, the surface of the resulting crystallized silicon film has the irregular shape as shown in FIG. 4.

The crystalline silicon film as shown in FIG. 4 has a film thickness which is 150 to 800 Å and has irregularities whose level difference is 100 to 700 Å.

Since the tip of the peak of the irregularities has roundness, the movement of carriers conducting on the surface of the crystalline silicon film is not impeded owing to the effect of the peaks, and hence it is possible to impart the high mobility.

Incidentally, as the prior art technology of the present invention, a technique of improving the characteristic properties of silicon film by specifying the film thickness and surface irregularities of the crystalline silicon film is disclosed in Japanese Patent Publication No. 1367/1990. In this official gazette, the one in which the surface irregularities of a 4000 Å thick crystalline silicon film (polycrystalline silicon film) formed by plasma CVD utilizing RF discharge is below 800 Å is mentioned.

However, the crystalline silicon film having the surface state as shown in FIG. 4 cannot be obtained in the case where an amorphous silicon film is crystallized by mere heating or by irradiation with laser light to a silicon film having a film thickness above 1000 Å.

The crystalline silicon film formed by plasma CVD is of no practical use on account of many defects in the film. Even though laser light is irradiated to eliminate these defects, the film thickness is as thick as 4000 Å and the effect of laser light irradiation does not reach the inside of the film, and hence it is impossible to obtain a silicon film having good crystal properties. In addition, in the case where the active layer of a thin film transistor is constructed using a crystalline silicon film having a thickness as great as 4000 Å, as mentioned above, the step coverage of the gate insulating film is deteriorated and hence the leakage current on the side of the active layer becomes salient, and it is impossible to obtain a thin film transistor having practical usefulness.

That is, it can be said that the crystalline silicon film having the surface state as shown in FIG. 4 and also having good crystal properties can be obtained only when laser light is irradiated to a silicon film having a film thickness below 800 Å to obtain a crystalline silicon film.

The desirable relationship between the film thickness and the level difference of irregularities is such that the average of the level difference of irregularities is 50 to 100% of the average film thickness. Of course, in this case, too, it is necessary that the average thickness of the film thickness should be 150 to 800 Å.

The crystalline silicon film as shown in FIG. 4 is such that since the tip of the peak of the surface irregularities has a curved surface having a radius of curvature greater than about 10 Å, when the gate insulating film is formed on its surface, utilizing as the active layer, there occurs utility that electrostatic breakage due to electric field concentration hardly occurs.

Also, since the tip of the peak of the crystalline silicon film has roundness, there is little likelihood that the movement of carriers conducting on the surface of the crystalline silicon film is impeded by the effect of peaks, and consequently it is possible to impart high mobility.

Therefore, it is useful to use the crystalline silicon film crystallized by the action of metal elements to promote the crystallization of silicon, as the starting film to obtain the crystalline silicon film having irregularities as shown in FIG. 4. This crystalline silicon film can be obtained by introducing a metal element, such as nickel, in a trace amount into the amorphous silicon film and performing heat treatment at about 550° C.

The crystalline silicon film which is obtained by promoting its crystal properties by irradiation with laser light to the crystalline silicon film obtained by the action of this metal element possesses extremely stable electrical properties. In this case, it is possible to obtain the crystalline silicon film having good crystal properties without being greatly affected by instability etc. of the laser oscillating apparatus.

The amount of the above-mentioned metal element to promote the crystallization of silicon should be $1\times10^{16}$ to $5\times10^{19}$ $cm^{-3}$, preferably $1\times10^{18}$ to $5\times10^{19}$ $cm^{-3}$. Therefore, especially in the case where the removal of metal element or the getting is not performed, it is necessary that the concentration of the metal element in the crystalline silicon film finally obtained should be $1\times10^{16}$ to $5\times10^{19}$ $cm^{-3}$, preferably $1\times10^{18}$ to $5\times10^{19}$ $cm^{-3}$. The term "concentration" as used herein is defined as the minimum value measured by SIMS (secondary ion mass spectrometry).

The reason why the amount of metal element to be introduced is limited in the above-mentioned range is that if the amount introduced is small, the action to promote crystallization is low, and if the amount introduced is large, silicide is formed in the film and the characteristic properties as semiconductor are impaired.

As the above-mentioned metal element to promote the crystallization of silicon, it is possible to use one kind of or plural kinds of elements selected from Fe, Co, Ni, Ru, Rh, Pd, Os, Ir, Pt, Cu, and Au. It is possible to mention nickel as the element whose effect is remarkably great.

As the remarkable action of this metal element which promotes the crystallization of silicon, it is possible to mention the action which performs crystallization parallel (in the direction parallel to the surface of the film) to the substrate. This is the phenomenon that the crystal growth more than several tens of μm toward the periphery from the region where the above-mentioned metal element has been introduced (referred to as lateral growth hereinafter) is performed by selectively introducing a metal element into part of the amorphous silicon film formed on the substrate having an insulating surface and subsequently performing heat treatment.

The above-mentioned lateral growth proceeds in the direction parallel to the substrate, and the crystal growth proceeds in the form of column or needle. And, this crystal growth which has been performed in the form of column or needle becomes a state in which amorphous components remain in its interstices. Therefore, it is possible to crystallize the remaining amorphous components by irradiating laser to the region which has undergone lateral growth by heat treatment, and it is possible to increase the crystallinity. FIG. 4 shows the surface of the thus obtained crystalline silicon film.

The crystalline silicon film as shown in FIG. 4 is characterized by that its film thickness is 150 to 800 Å and simultaneously the level difference of its irregularities is 100 to 700 Å.

BRIEF DESCRIPTION OF THE DRAWINGS

FIGS. 2(A) and 2(B) shows structural diagrams of a conventional thin film transistor.

DETAILED DESCRIPTION OF THE PREFERRED EMBODIMENTS

EXAMPLE 1

FIG. 3 shows the steps of fabrication of crystalline silicon film having the crystal properties shown in this example. First, a silicon oxide film 102 is formed to a thickness of 3000 Å on a glass substrate 101 (Corning 7059 glass) by the sputter method.

Then, an amorphous silicon film 103 is formed to a thickness of 500 Å by the plasma CVD method or reduced-pressure heated CVD method. In the case where the reduced-pressure heated CVD method is employed, it is desirable that the heating temperature should be below 550° C. The reason for this is that the strain point of the Corning 7059 glass substrate 101 is 593° C. and the heating at temperatures above 550° C. (with some allowance) brings about intolerable shrinkage and deformation. Incidentally, this applies to all the steps involving heating, and hence an attention is necessary.

Then, a solution (solution of nickel acetate) containing nickel, which is a metal element to promote the crystallization of silicon, is applied to the surface of the amorphous silicon film 103, thereby forming a water film 302. And, spin coating is performed by using the spinner 301. (FIG. 3(A))

Figure 3A:
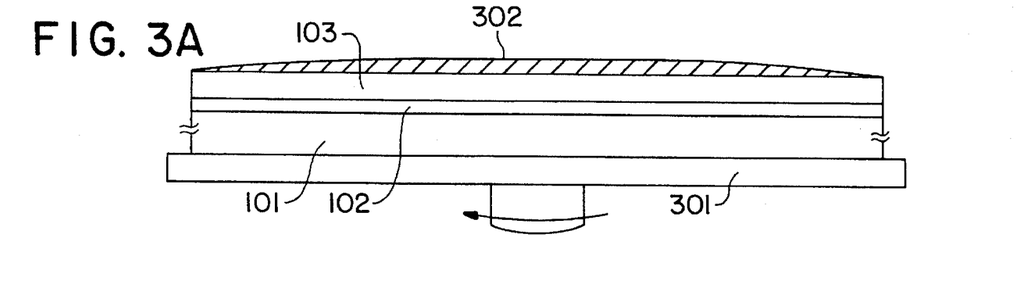
FIGS. 3(A) to 3(D) show the steps of fabrication of crystalline silicon film.

As the result of coating with nickel acetate solution by spin coating as shown in FIG. 3(A), nickel or a nickel-containing layer 303 is formed on the surface of the amorphous silicon film 103. This layer 303 has a thickness of several tens to several hundreds of Å and it is difficult to observe it as a film. In this state, the state in which nickel element is held in contact with the surface of the amorphous silicon film 103 is realized. (FIG. 3(B))

Figure 3B:
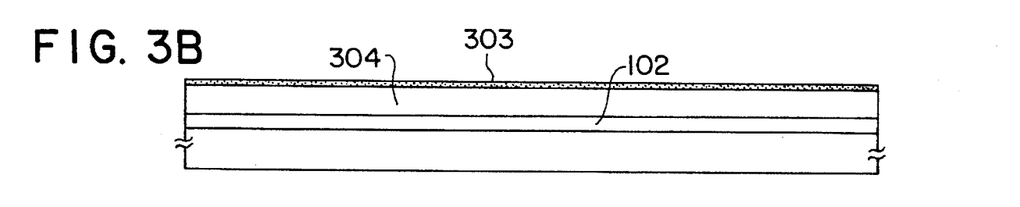

Heat treatment is performed in the state of FIG. 3(B), thereby crystallizing the amorphous silicon film 103. In this case, the heat treatment is performed at 550° C. for 4 hours in a nitrogen atmosphere. Usually, in the case where heat treatment at 550° C. is performed on the amorphous silicon film 103, crystallization barely takes place after the lapse of time in excess of several hundreds of hours. However, as shown in this example, in the case where a metal element to promote crystallization is introduced, it is possible to obtain the crystalline silicon film by heat treatment at 550° C. for 4 hours.

In the case where nickel, which is a metal element to promote crystallization, is introduced as in this example, it is possible to bring about crystallization if the temperature is higher than 450° C. However, at the temperature of 450° C., it is necessary to spend time longer than several tens of hours and it is not practical. And, the upper limit of this heating temperature hinges upon the heat resistance temperature of the glass substrate 101. In general, in the case where a glass substrate is used, in view of the degree of shrinkage and distortion of the glass substrate, it is desirable that the upper limit of the heating temperature should be a temperature below the strain point of the glass substrate.

Figure 3C:
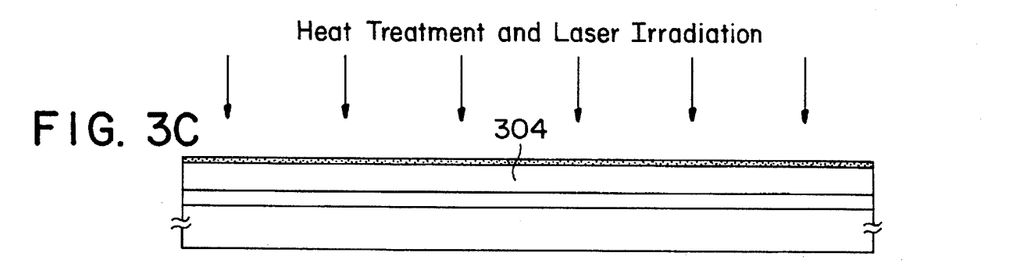

Subsequently, laser light is irradiated so as to anneal the crystalline silicon film 304 which has been crystallized in the preceding heat treatment. In this case, KrF excimer laser formed in a linear beam is used. That is, laser light formed such that the width is several mm and the length is several tens of cm is irradiated to the crystalline silicon film 304 by moving in the direction perpendicular to the lengthwise direction. In this step, the crystal properties of the crystalline silicon film 304 are improved and the defects and levels in the film are reduced.

Also, it is possible to reduce defects in the crystalline silicon film 304 by performing heat treatment after the completion of laser light irradiation. This heat treatment is effective if the temperature is higher than 450° C. The upper limit of the temperature of this heat treatment is limited by the strain point of the glass substrate 101.

Figure 3D:
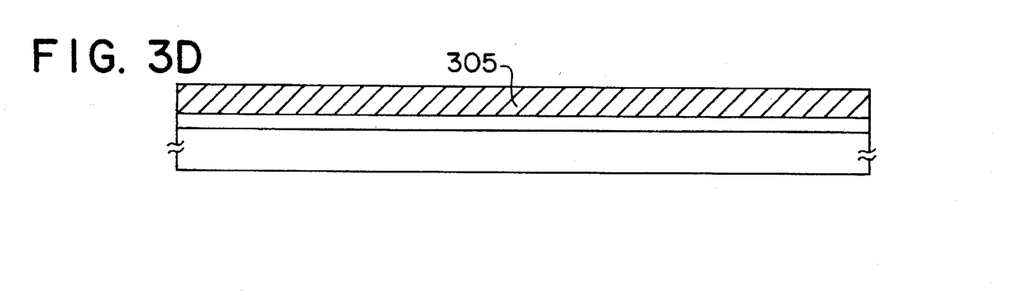

In this way, it is possible to obtain the crystalline silicon film 305 as shown in FIG. 3(D). In this example, the thickness of the amorphous silicon film 103, which is the starting film, was 500 Å Therefore, the thickness of the crystalline film 304 which had been crystallized by heat treatment was also about 500 Å (In practice, the film shrinks at the time of crystallization, but this can be ignored.) In the case where laser light is irradiated to the crystalline silicon film 304 which is as thin as mentioned above, the energy of laser light is sufficiently supplied to the lower layer region of the film and it is possible to perform almost uniform annealing in the film thickness direction and it is possible to perform uniform crystallization in the thickness direction.

Figure 5:
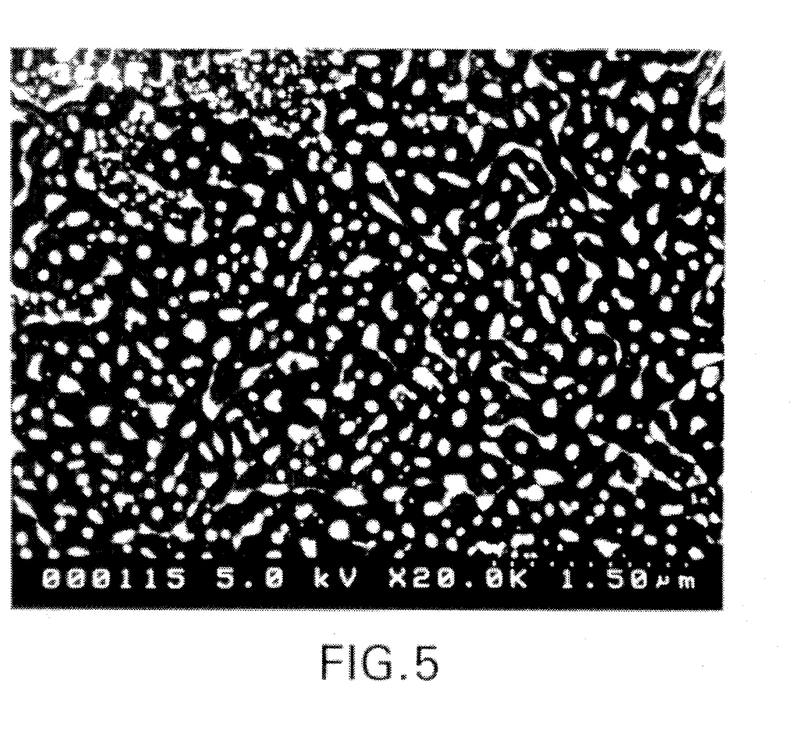
FIG. 5 shows a photograph of thin film.

Also, in the case where laser light is irradiated to the crystalline silicon film 304 which is as thin as 500 Å, it is confirmed that its surface becomes irregular as shown in FIG. 4 after laser light irradiation. FIG. 4 is a photograph taken when the surface of the crystalline silicon film 305 was observed by an atomic force microscope (AFM) (in the state shown in FIG. 3(D)) after laser light irradiation as shown in FIG. 3(C). FIG. 5 is a photograph taken by SEM (scanning electron microscope) of the surface of the crystalline silicon film 305 shown in FIG. 4.

From the surface photograph of the crystalline silicon film 305 shown in FIG. 4, it is noted that the level difference of irregularities is about 100 to 700 Å. It is also noted that the forward end (tip) of the peak is round and has a radius of curvature greater than 10 Å and the bottom (hollow part) of the valley has a radius of curvature which is larger than that of the tip of the peak (or is more round than the tip of the peak).

It is known that high characteristic properties can be obtained if the thin film transistor is constructed with the crystalline silicon thin film 305 having the surface as shown in FIG. 4.

EXAMPLE 2

This example is an example intended to produce a thin film transistor of N-channel type using the crystalline silicon film 305 obtained in Example 1, and FIG. 6 shows a sectional view of the thin film transistor in each step of fabrication in this example.

First, a crystalline silicon film 305 which is 500 Å thick is formed on a glass substrate 101 (Corning 7059) on which an underlying film 102 has been formed according to the step shown in FIG. 3. (FIG. 6(A))

Then, a silicon oxide film 105 which functions as the gate insulating film is formed to a thickness of 1000 Å by the plasma CVD method. Further, an aluminum film containing scandium is formed to a thickness of 6000 HÅ and a gate electrode 601 composed mainly of aluminum is formed by performing patterning. After the gate electrode 601 has been formed, anodization is performed using the gate electrode 601 as the anode in an electrolytic solution, thereby forming an oxide layer 602 to a thickness of 2000 Å. This oxide layer 602 becomes a mask to form the offset region in the subsequent impurity ion step. (FIG. 6(B))

Figure 6A:
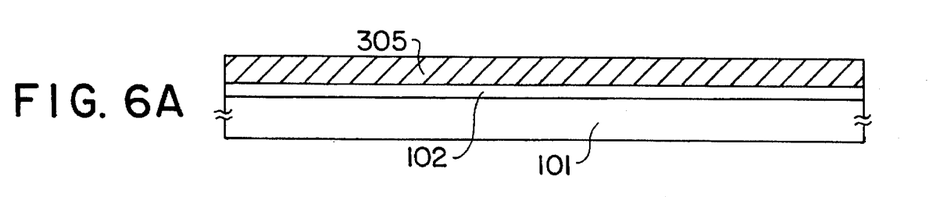
FIGS. 6(A) to 6(D) show the steps of fabrication of a thin film transistor.
Figure 6B:
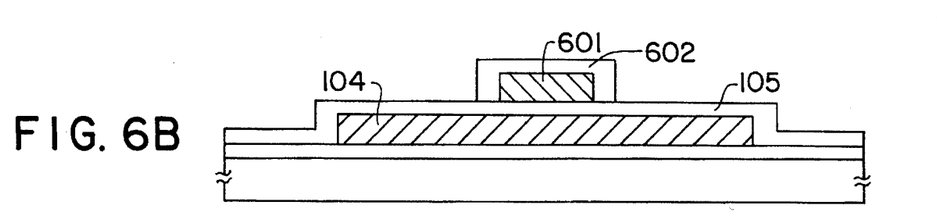
Figure 6C:
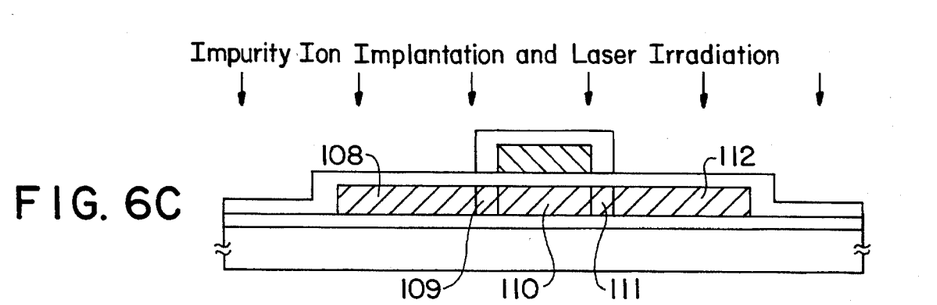
Figure 6D:
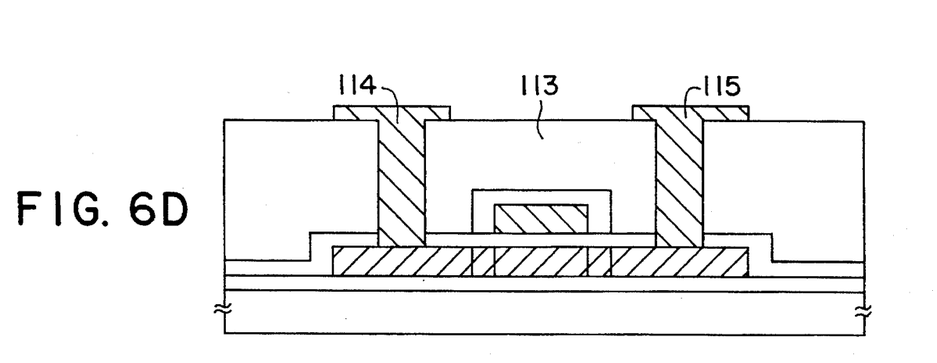

Then, implantation of phosphorus (as impurity ions to form the source/drain regions) is performed by the plasma doping method or ion implantation method. In this step, the source region 108 and the drain region 112 are formed self-alignment manner. Simultaneously, the channel forming region 110 and the offset gate regions 109, 111 are formed. The offset regions 109, 111 are formed because the oxide layer 602 surrounding the gate electrode 601 becomes a mask.

Further, laser light irradiation is performed, thereby recrystallizing the source region 108 and drain region 112 in which impurity ions have been implanted (but which have been made amorphous due to implantation of impurity ions) and activating the implanted impurities. (FIG. 6(C))

In this step, too, it is possible to effectively recrystallize the source/drain regions 108, 112 and activate impurities by laser light irradiation because the thickness of the active layer 104 is as thin as 500 Å. In this step, it is effective to irradiate laser light while heating the sample at a temperature of about 450° to 550° C. It may irradiate intense light (such as infrared rays) in place of laser light irradiation. However, its effect is low as compared with the case of laser light irradiation.

Then, a silicon oxide film 113 as the interlayer insulating film is formed to a thickness of 6000 Å by the plasma CVD method. Further, contact holes are formed and the source electrode 114 and the drain electrode 115 are formed. Finally, heat treatment is carried out in a hydrogen atmosphere at 350° C., and the thin film transistor is completed. (FIG. 6(D))

The thin film transistor produced in this example is of N-channel type, and it is known that the thin film transistor has high performance, with uniform mobility as high as 100 $cm^2/Vs$, and permits high production yields. The first reason for this is that the active layer using the crystalline silicon film obtained by the method shown in FIG. 1 has good crystal properties. In addition, the fact that the bottom of the hollow part of the irregularities has roundness and hence there is no scattering at the time of carrier movement may be mentioned as the second reason.

Also, the good characteristic properties and high yields are presumably due to the fact that the thin film silicon semiconductor film obtained in Example 1 is such that the tip of the peak of the surface having irregularities is not sharp but has roundness having a radius of curvature greater than about 10 Å and hence the electric field does not concentrate at the tip of the peak, and in the case where it is used as the active layer of thin film transistor, insulation breakage through the gate insulating film hardly occurs.

EXAMPLE 3

This example relates to an example for crystal growth in the direction parallel to the film from the specific region (referred to as sideward growth or lateral growth) by introduction of a metal element to promote the crystallization of silicon into the specific region of the amorphous silicon film.

Figure 7A:
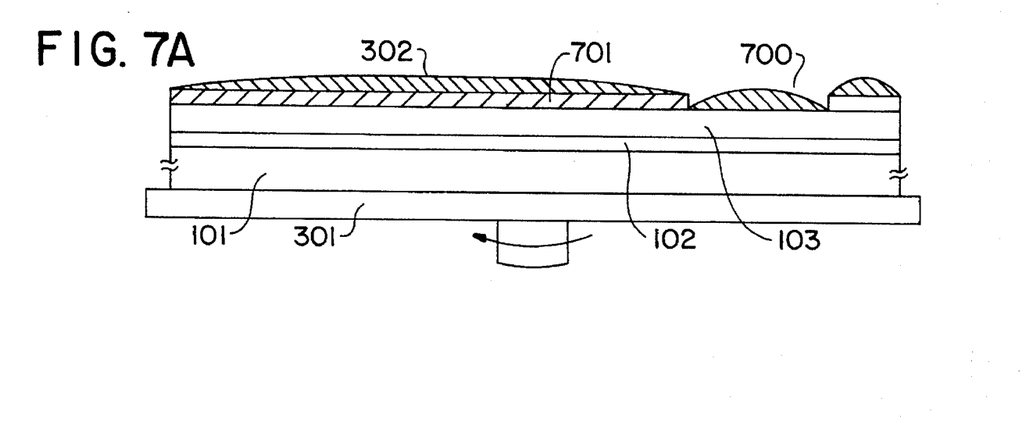
FIGS. 7(A) to 7(D) show the steps of fabrication of crystalline silicon film.

FIG. 7(A) shows the step for forming a crystalline silicon film on a glass substrate 101. First, a silicon oxide film 102 as the underlying film is formed to a thickness of 3000 Å on a glass substrate 101 by the sputter method. Then, an amorphous silicon film 103 is formed to a thickness of 500 Å by the plasma CVD method or reduced-pressure heated CVD method.

Then, a mask 701 is formed using a resist. This mask 701 may be formed from silicon oxide film or silicon nitride film. This mask has such a structure that the amorphous silicon film 103 is exposed in the region indicated by 700. The region in which the amorphous silicon film 103 indicated by 700 is exposed has a rectangular shape having the long side extending toward the back of the figure. (FIG. 7(A))

After the mask 701 has been formed, a metal element to promote the crystallization of silicon is introduced into the amorphous silicon film 103. In this case, nickel is used as the metal element. Also, the nickel element is introduced into the amorphous silicon film 103 using a solution of nickel acetate. That is, introduction of nickel element into the surface of the amorphous silicon film 103 is performed using a solution containing nickel.

To be more specific, a solution of nickel acetate is dropped to form a water film 302 as shown in FIG. 7(A). Then, spin coat is performed using a spinner 301. In this way nickel element, which is a metal element to promote the crystallization of silicon, is introduced into the region where the amorphous silicon film 103 indicated by 700 is exposed.

Figure 7B:
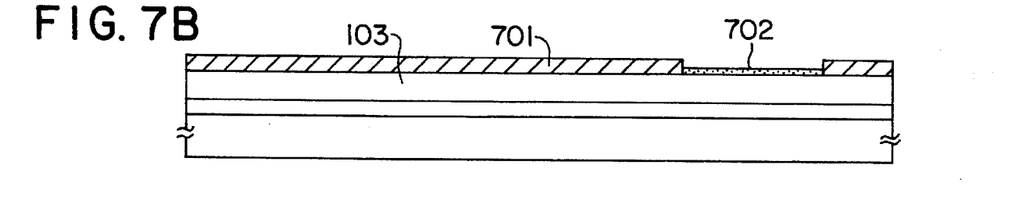

In this way, it is possible to obtain the state shown in FIG. 7(B). In such state, an extremely thin nickel layer indicated by 702 or an extremely thin layer containing nickel is formed in contact with part of the amorphous silicon film 103.

Figure 7C:
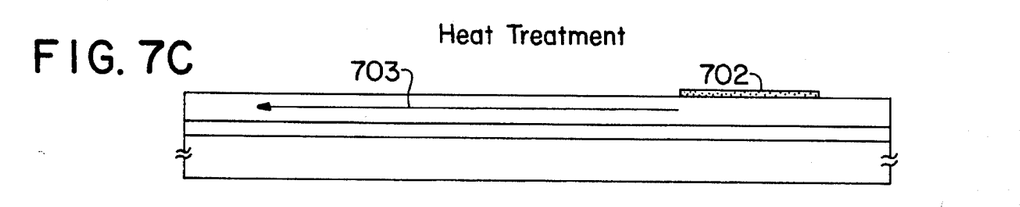

Subsequently, the resist mask 701 is removed. Further, heat treatment is performed at 550° C. for 4 hours. In this heat treatment step, crystal growth in the direction (indicated by an arrow 703) parallel to the substrate 101 takes place. This proceeds as nickel diffuses from the nickel layer or the layer 702 containing nickel. (FIG. 7(C))

Figure 7D:
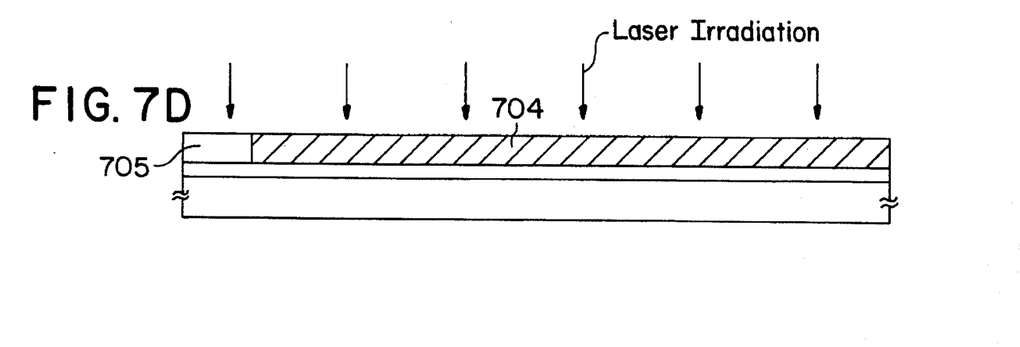

Further, the region in which crystal growth has been allowed is irradiated with laser light so as to improve the crystal properties. Since the thickness of the silicon film is about 500 Å, this laser irradiation supplies sufficient laser light energy so as to complete crystallization. The surface of the resulting crystalline silicon film 704 has the same state as shown in FIGS. 4 and 5. The concentration of nickel is maximum in the region 705 where the crystal growth terminates. Therefore, the active layer of semiconductor should be formed such that this region 705 is eliminated. (FIG. 7(D))

In the case where the thin film transistor is formed using the region in which crystal growth takes place in the direction parallel to the substrate as shown in this example, it is possible to obtain the following significance. That is, it is possible to construct such that the movement of carriers is hardly affected by the crystal grain boundary if the source/drain regions are arranged along the direction in which crystal growth takes place so that carriers move along the direction of crystal growth, and it is possible to obtain high characteristic properties.

EXAMPLE 4

This example shows an example in which the amorphous silicon film formed on a glass substrate is crystallized by only laser light irradiation. As mentioned above, to obtain a crystalline silicon thin film of large area by mere laser light irradiation poses a problem with uniformity, and hence it is not so practical a way. However, it is of practical use in the case where the area of the substrate is small or a laser oscillator of large output is employed. In the case where a laser oscillator of large output is employed, it is possible to irradiate laser light at a stable output for a large area by contriving the optical system.

In this example, a silicon oxide film as the underlying layer is formed on a glass substrate and then an amorphous silicon film is formed to a thickness below 800 Å, preferably 500 Å and finally laser light irradiation is carried out to obtain the crystalline silicon film.

The present invention permits one to obtain in high yields crystalline silicon film superior in crystallinity by irradiating with laser light silicon film having a thickness of 150 to 800 Å. And it is possible to obtain in high yields thin film transistors having superior characteristic properties by using this crystalline silicon film.

What is claimed is:

1. A semiconductor device using a silicon film having crystallinity, wherein an average film thickness of said silicon film is 150 to 800 Å;

a surface of said silicon film has irregularities, and a level difference between a highest portion of said irregularities and a lowest portion thereof is 100 to 700 Å, and a tip of said highest portion has a roundness having a radius of curvature greater than 10 Å.

2. The semiconductor device of claim 1, wherein a metal element to promote a crystallization of silicon is contained in said silicon film in a concentration of $1 \times 10^{18}$ to $5 \times 10^{19}$ cm$^{-3}$.

3. The semiconductor device of claim 2, wherein at least one of elements selected from Fe, Co, Ni, Ru, Rh, Pd, Os, Ir, Pt, Cu, and Au are used as the metal element to promote the crystallization of said silicon.

4. The semiconductor device of claim 1, wherein a metal element to promote a crystallization of silicon is contained in said silicon film in a concentration of $1 \times 10^{16}$ to $5 \times 10^{19}$ cm$^{-3}$.

5. The semiconductor device of claim 4, wherein at least one of elements selected from Fe, Co, Ni, Ru, Rh, Pd, Os, Ir, Pt, Cu, and Au are used as the metal element to promote a crystallization of said silicon.

6. A semiconductor device using a silicon film having crystallinity, wherein an average film thickness of said silicon film is 150 to 800 Å;

a surface of said silicon film has irregularities, and a height difference between a peak of said irregularities and a valley thereof is 100 to 700 Å;

said silicon film has an active region in which crystal growth takes place in a direction parallel to a substrate; and a tip of said peak has a roundness having a radius of curvature greater than 10 Å.

7. The semiconductor device of claim 6, wherein a metal element to promote a crystallization of silicon is contained in said silicon film in a concentration of $1 \times 10^{18}$ to $5 \times 10^{19}$ cm$^{-3}$.

8. The semiconductor device of claim 7, wherein at least one of elements selected from Fe, Co, Ni, Ru, Rh, Pd, Os, Ir, Pt, Cu, and Au are used as the metal element to promote the crystallization of said silicon.

9. The semiconductor device of claim 6, wherein a metal element to promote a crystallization of silicon is contained in said silicon film in a concentration of $1 \times 10^{16}$ to $5 \times 10^{19}$ cm$^{-3}$.

10. The semiconductor device of claim 9, wherein at least one of elements selected from Fe, Co, Ni, Ru, Rh, Pd, Os, Ir, Pt, Cu, and Au are used as the metal element to promote a crystallization of said silicon.

11. A semiconductor device using a silicon film having crystallinity, wherein an average film thickness of said silicon film is 150 to 800 Å;

a surface of said silicon film has irregularities;

a level difference between a highest portion of said irregularities and a lowest portion thereof is 50 to 100% of said average film thickness; and wherein a tip of said highest portion has a roundness having a radius of curvature greater than 10 Å.

12. A semiconductor device comprising:

a substrate having an insulating surface;

a channel semiconductor layer formed on said insulating surface, said semiconductor layer comprising crystalline silicon;

source and drain semiconductor layers between which said channel semiconductor layer extends;

a gate insulating layer adjacent to said channel semiconductor layer; and a gate electrode adjacent to said semiconductor layer with said gate insulating layer interposed therebetween, wherein an average thickness of said channel semiconductor layer is 150 to 800 Å, said channel semiconductor layer has a surface roughness, a level difference between a peak of said surface roughness and a bottom thereof is 100 to 700 Å, and a tip of said peak has a roundness having a radius of curvature greater than 10 Å.

13. The semiconductor device of claim 12, wherein said channel semiconductor layer contains a catalyst for promoting a crystallization of silicon.

* * * * *